(12) United States Patent
Minsek et al.

(10) Patent No.: US 8,337,942 B2
(45) Date of Patent: Dec. 25, 2012

(54) LIGHT INDUCED PLATING OF METALS ON SILICON PHOTOVOLTAIC CELLS

(76) Inventors: David W. Minsek, New Milford, CT (US); Lev Taytsas, Naugatuck, CT (US)

(*) Notice: Subject to any disclaimer, the term of this patent is extended or adjusted under 35 U.S.C. 154(b) by 0 days.

(21) Appl. No.: 13/188,615

(22) Filed: Jul. 22, 2011

(65) Prior Publication Data

US 2011/0275175 A1 Nov. 10, 2011

Related U.S. Application Data

(63) Continuation-in-part of application No. 12/549,547, filed on Aug. 28, 2009.

(51) Int. Cl.
*B05D 5/06* (2006.01)
(52) U.S. Cl. .......................................... 427/74
(58) Field of Classification Search ................. 427/226, 427/74
See application file for complete search history.

(56) References Cited

U.S. PATENT DOCUMENTS

| | | | |
|---|---|---|---|
| 4,126,524 A | 11/1978 | Hradil et al. | |
| 4,144,139 A | 3/1979 | Durkee | |
| 4,246,077 A | 1/1981 | Hradil et al. | |
| 4,251,327 A | 2/1981 | Grenon | |
| 5,322,553 A * | 6/1994 | Mandich et al. | 106/1.23 |
| 5,601,696 A | 2/1997 | Asakawa | |
| 5,882,435 A * | 3/1999 | Holdermann | 438/57 |
| 6,166,856 A | 12/2000 | Araki et al. | |
| 6,183,545 B1 * | 2/2001 | Okuhama et al. | 106/1.18 |
| 6,251,249 B1 | 6/2001 | Chevalier et al. | |
| 2004/0022934 A1 | 2/2004 | Leung et al. | |
| 2006/0003170 A1 * | 1/2006 | Saito et al. | 428/426 |
| 2007/0151863 A1 | 7/2007 | Morrissey | |
| 2008/0035489 A1 * | 2/2008 | Allardyce et al. | 205/263 |
| 2008/0249280 A1 * | 10/2008 | Kageyama et al. | 528/271 |
| 2009/0120497 A1 | 5/2009 | Schetty, III | |

FOREIGN PATENT DOCUMENTS

WO 2005/083799 9/2005

* cited by examiner

*Primary Examiner* — Michael Cleveland
*Assistant Examiner* — Robert Vetere
(74) *Attorney, Agent, or Firm* — Carmody & Torrance LLP

(57) ABSTRACT

A method and composition for plating metal contacts on photovoltaic solar cells is described. The cell is immersed in an aqueous bath containing platable metal ions and a solubilizing agent for aluminum or aluminum alloy ions from the back side of the solar cell. The cell is then exposed to light, causing the two sides of the cell to become oppositely charged. The metal ions are plated without requiring an external electrical contact.

17 Claims, 2 Drawing Sheets

LIGHT INDUCED PLATING OF METALS ON SILICON PHOTOVOLTAIC CELLS

Figure 1:
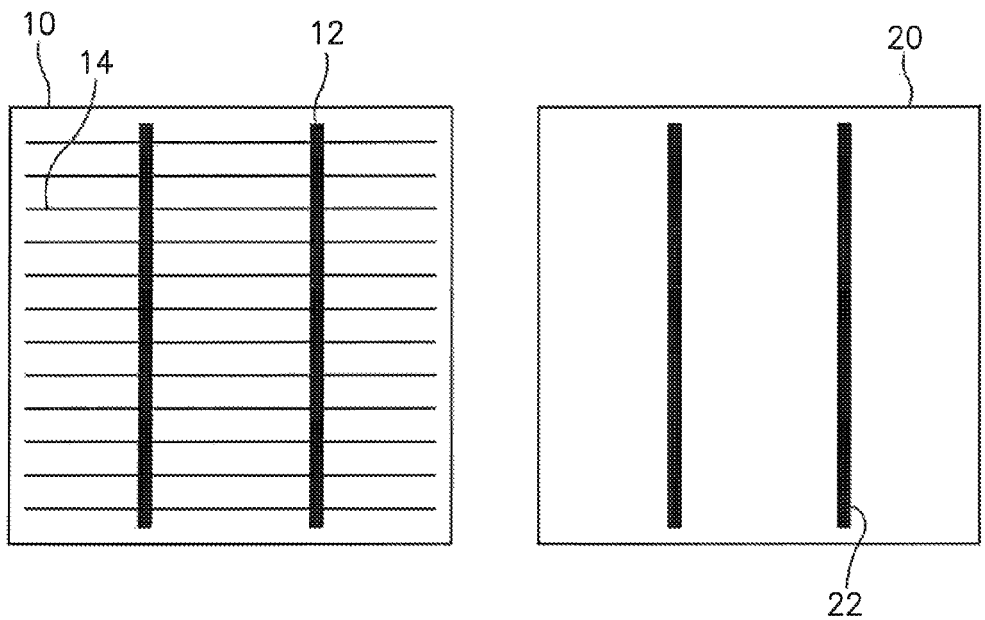

This application is a continuation in part of U.S. application Ser. No. 12/549,547, filed on Aug. 28, 2009, which is pending.

FIELD OF THE INVENTION

The present invention relates generally to a method of light induced plating of metal contacts on photovoltaic cells, including silicon solar cells.

BACKGROUND OF THE INVENTION

Solar cells are photovoltaic cells or modules, which convert sunlight directly into electricity. Photovoltaic (PV) cells are made of semiconductor materials, most commonly silicon. When light (ultraviolet, visible and infrared radiation) strikes the cell, a certain portion of it is absorbed within the semiconductor material, such that the energy of the absorbed light is transferred to the semiconductor and an electrical current is produced. By placing metal contacts on the top and bottom of the PV cell, the current can be drawn off to use externally. The current, together with the cell's voltage, defines the wattage that the solar cell can produce.

A typical semiconductor photovoltaic cell comprises a large area p-n junction, where absorption of light results in the creation of electron-hole pairs. The electrons and holes migrate to opposite sides of the junction such that excess negative charge accumulates on the n-doped side and excess positive charge accumulates on the p-doped side. In order for the current to be collected for power generation, electrical contact of both sides of the pn junction to an external circuit must be made. The contacts typically consist of two metallic patterns, with one on each side, in ohmic contact with the semiconductor device. The ideal contacting pattern will have high conductivity in order to minimize resistive losses, good electrical contact to the substrate in order to efficiently collect current, and high adhesion to ensure mechanical stability. The metal pattern on the cell front-side, defined as the side of the cell which is exposed to incident light, is designed to provide a low resistance path for collecting current generated at any location on the surface of the cell and, simultaneously, to minimize the amount of incident radiation intercepted by the metal and thus lost for current generating purposes.

Silicon, especially in its crystalline form, is a common material used for producing solar cells. Most solar cells are made from crystalline silicon, doped with boron and phosphorus to produce a p-type/n-type junction. Polycrystalline silicon can be used in solar cell fabrication to cut manufacturing costs, although the resulting cells may not be as efficient as single crystal silicon cells. Amorphous silicon, which has no crystalline structure, may also used, again in an attempt to reduce production costs. Other materials used in solar cell fabricated include gallium arsenide, copper indium diselenide and cadmium telluride.

A typical arrangement of a silicon solar cell comprises as follows:
  (a) a back contact usually comprising a layer of aluminum or aluminum alloy and busbars comprised of silver or a silver-aluminum alloy;
  (b) a P-type Si;
  (c) an N-type Si;
  (d) an antireflective coating on the front-side of the cell;
  (e) a front contact usually comprising a metallic grid of fingers and busbars; and
  (f) a cover glass.

Because silicon is extremely reflective, an antireflective coating is typically applied to the top of the cell to reduce reflection losses. A glass cover plate is then typically applied over the antireflective layer to protect the cell from the elements.

Conventional solar cells may be made using crystalline silicon wafers. The Si wafer starts as a p-type semiconductor with a boron dopant. To better capture light, the wafer may be texturized with hydroxide or nitric/hydrofluoric acids so that light is obliquely reflected into the silicon. The p-n junction is formed by diffusion of an n-type dopant, typically phosphorus, using vapor deposition or diffusion. A layer of dielectric is applied, typically silicon nitride or silicon oxide, to the front-side; this layer serves as both a surface passivation layer and an anti-reflective coating (ARC).

In one standard process of silicon solar cell fabrication, the front side of the silicon wafer is coated with an anti-reflective passivation layer, which typically comprises silicon nitride. This silicon nitride layer serves the dual purpose of maximizing the percentage of light absorbed by the cell (not reflected), as well as passivating the surface, which prevents electron-hole recombination at the surface and thus increases cell efficiency. A different effect is typically employed on the cell back surface to minimize electron-hole recombination. A "back surface field" (BSF) is achieved by making a so-called $p^+$-doped layer in the silicon close to the rear surface, where the $p^+$-doped layer contains a higher concentration of p-dopant than the bulk p-doped substrate. This creates an electric field close to the interface which provides a barrier to minority carrier (electron) flow to the rear surface. Any p-dopant such as aluminum or boron may be used. Typically aluminum or aluminum alloy is deposited on the back surface and fired at high temperature in order to diffuse p-dopant into the silicon. The aluminum or aluminum alloy may be deposited by screen printing or vapor deposition. Typically, in a standard process for silicon solar cell fabrication, solderable busbars comprising silver or silver-aluminum paste are screen printed on the rear surface, then aluminum paste is screen printed over the entire back surface except areas covered by the busbars, then fired to remove solvent binders, harden the paste layers, and diffuse the aluminum p-dopant into the silicon.

The solar cell contacts must be formed, whereby a full area metal contact is made on the back surface comprising the $p^+$-doped BSF and solderable busbars as described above, and a grid-like metal contact made up of fine "fingers" and larger "busbars" is formed on the front surface, typically formed by screen printing silver paste into a pattern of said fingers and busbars, then firing at high temperature to remove solvent binders, harden the pattern, and form ohmic contact to the cell. After the solar cell conductors are formed, multiple solar cells are then interconnected in series (and/or parallel) by flat wires or metal ribbons, and assembled into modules or "solar panels." The finished solar panel product typically has a sheet of tempered glass on the front and a polymer encapsulation on the back to protect it from the environment.

Silicon is the most commonly used material for solar cell panel manufacturing. FIG. 1 shows the front side 10 having front side metal busbars 12 and metal lines 14 and the backside 20 having backside metal busbars 22 of a typical silicon solar cell. The metal busbars 12 and metal lines 14 on the front side of the solar cell preferably comprise a printed silver paste which is plated upon with the plating composition and method of this invention. The backside metal busbars 22 preferably comprise either silver paste or an aluminum-silver paste in contact with silicon. The remainder of the cell back side is preferably covered by a fired aluminum layer 38.

Figure 2:
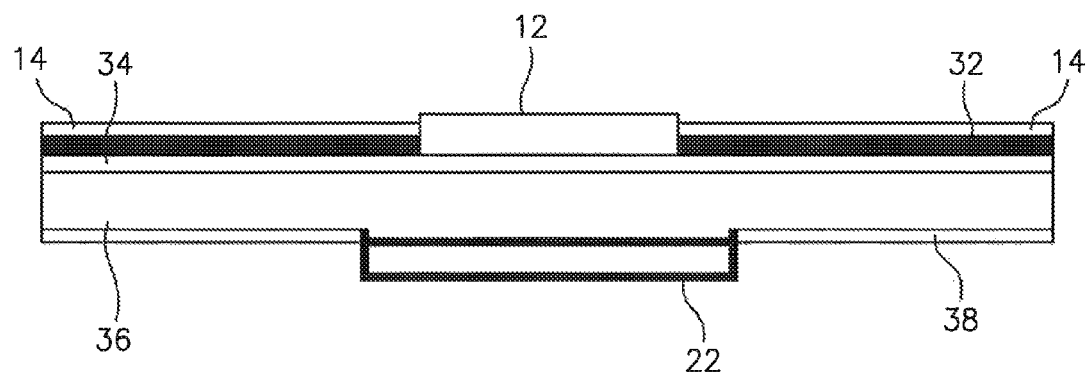

FIG. 2 shows a cross-sectional view of a typical silicon solar cell having an anti-reflective coating layer 32, an n-doped silicon layer 34 and a p-doped silicon layer 36. The silicon may be single crystalline or multicrystalline silicon, by way of example and not limitation. The metal lines 14 on the front side 10 collect the light-induced current. The front side busbars 12 collect current from the multiple metal lines 14 or "fingers." The backside 20 of the cell typically has a set of busbars 22 similar to the front side; however, the backside 20 does not need to allow for transmission of light. The front side busbars 12 and backside busbars 22 allow for the connection of cells in series for modules. The backside busbars 22 contact the silicon substrate. The remainder of the back side is covered with a layer 38 of aluminum or aluminum alloy. The layer of aluminum or aluminum alloy 38 is generally applied, by printing an aluminum or aluminum alloy paste on the backside of the solar cell and then baking the layer.

Competing factors must be considered in designing the front side metal pattern. The front side of the device must allow transmission of light so the metal traces should cover the smallest possible area in order to minimize shading losses. On the other hand, efficient current collection favors the coverage of the largest possible surface area since the sheet resistance of the front side may be relatively high (about 50 to 100Ω per square), leading to resistive losses if the coverage is too low.

A variety of methods may be used to form the front metal pattern, including screen printing of conductive paste, ink jetting, and electroplating onto a seed layer. One commonly used method is screen printing of a silver paste containing a glass fit, followed by a firing step at about 800° C. during which the paste burns through the anti-reflective coating, if present, forming a grid of metal paste lines and busbars. While this method provides conductive patterns with reasonably good electrical contact, conductivity and adhesion, performance could be further improved by the deposition of additional metal onto the grid, since the post-fired paste necessarily contains voids and non-metallic filler.

In another method used to form a front side conductive pattern, metal is deposited from a solution of soluble metal ions onto a pattern of lines and busbars formed in the anti-reflective coating. A variety of methods may be used to form the pattern, such as photolithography followed by etching, mechanical scribing, or laser imaging. Such a method is described in International Publication No. WO 2005/083799.

Deposition of a metal from a solution of soluble metal ions occurs by an electrochemical mechanism, where oxidation and reduction reactions take place. Defined broadly, there are three different mechanisms for depositing metal on a substrate from solution:

(1) Displacement, also known as galvanic, deposition is where deposition of a metal on a less noble metal substrate is accompanied by transfer of electrons from the less noble to the more noble metal, resulting in deposition of the more noble metal and dissolution of the less noble metal substrate. This method may be limited in that the deposit may be limited in thickness since deposition will normally stop when the less noble substrate is completely covered. Also a portion of the substrate will be consumed. Also, the deposited metal layer may be non-continuous since deposition of the more noble metal is accompanied by dissolution of the underlying less noble metal, leading to poor conductivity and adhesion.

(2) Electrolytic plating is where oxidation and reduction are induced by means of an external source of electrical current. This method provides dense, high quality metal layers with fast deposition rates that are not limited in thickness. However, an electrical connection must be made to the substrate, with an anode present in the bath to complete the electrical circuit. Making good electrical contact with the cells may be problematic since it may result in breakage of the fragile silicon substrate.

(3) Autocatalytic, also known as electroless plating, deposition is where reduction of the metal ions is accomplished chemically by inclusion of a reducing agent in solution, where deposition only takes place on catalytically active surfaces. This method eliminates the need for electrical contact and an external power source. However, in practice this method suffers several drawbacks. Firstly, the process may be difficult to control since the solution is inherently thermodynamically unstable; spontaneous decomposition with precipitation of metal may occur unless great care is taken to optimize the system. This in turn limits deposition rates which may be very slow. In particular, autocatalytic silver plating solutions are well known in the art to be highly unstable.

To solve some of these problems, the prior art has suggested various methods of electroplating on photovoltaic devices utilizing, for example, light-induced voltage to effect metal deposition.

U.S. Pat. No. 4,144,139 to Durkee, the subject matter of which is herein incorporated in its entirety, describes a method for plating electrical contacts onto the surface of a solar cell by immersion of the cell in an electrolyte solution containing metal ions and exposing the surface of the solar cell to light such that plating of metal occurs on the anode surface of the device. The back (anodic) side is covered by a thick sacrificial layer of silver, such that silver dissolves from the anodic backside and deposits on the cathodic front side when the device is irradiated. A cyanide-containing silver plating solution is described. Although cyanide-containing silver electrolytes are well known to yield excellent plating results, the use of cyanide is not preferred due to safety as well as environmental considerations.

Figure 3:
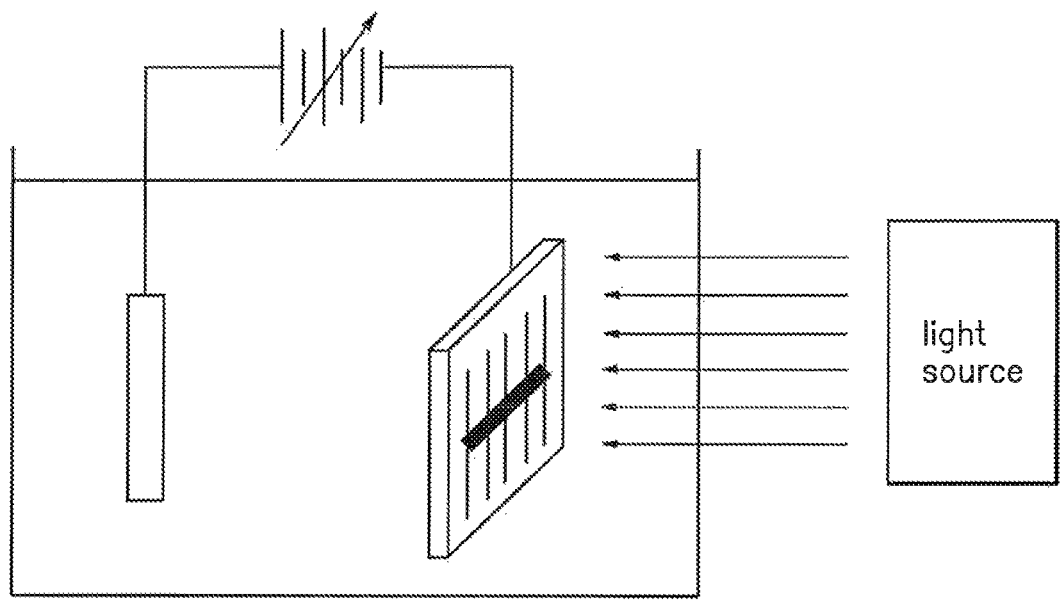

U.S. Pat. No. 4,251,327 to Grenon, the subject matter of which is herein incorporated by reference in its entirety, describes an electrolytic method for plating similar to that described in U.S. Pat. No. 4,144,139. In addition, this patent describes an arrangement where the anodic backside of the device is attached to the negative terminal of a DC power supply and the positive terminal of the power supply is attached to a silver electrode in the plating solution, such that when the cell is irradiated with light and the current is adjusted appropriately, neither deposition nor corrosion occurs on the backside. Again, a cyanide-containing silver plating solution is used. This arrangement is shown in FIG. 3. A negative aspect of this method is the requirement of attachment of an electrode to the cell, which may result in breakage of fragile silicon substrates.

U.S. Pat. No. 5,882,435 to Holdermann, the subject matter of which is herein incorporated by reference in its entirety, describes a process where a printed metallic front side pattern on a photovoltaic cell is reinforced by photo-induced deposition of a metal such as copper or silver. The back (anodic) side includes a printed sacrificial metal paste such that charge neutrality is maintained by dissolving of metal from the back side concurrent with deposition on the front side when the device is irradiated.

U.S. Patent Publication No. 2008/0035489 to Allardyce, the subject matter of which is herein incorporated by reference in its entirety, describes a method of plating electrical contacts on photovoltaic devices where the device is exposed to light while immersed in a silver plating solution comprising silver ions, at least one of a nitro-containing compound, a surfactant, an amino compound and at least one of either an amino acid or sulfonic acid. However, this electrolytic "light induced plating method" for metallizing photovoltaic devices is the same or similar to the method described in the previously described U.S. Pat. No. 4,251,327 and suffers from the same deficiency, namely the requirement of attachment to the cell of an electrode connected to a current source and anode.

U.S. Patent Publication No. 2007/0151863 to Morrissey, the subject matter of which is herein incorporated by reference in its entirety, describes a non-cyanide silver electroplating composition comprising silver in the form of a complex with hydantoin or substituted hydantoin, an electrolyte, and 2,2'-dipyridyl.

U.S. Pat. No. 5,601,696 to Asakawa, the subject matter of which is herein incorporated by reference in its entirety, describes a cyanide-free silver electroplating bath containing silver in the form of a complex with hydantoin or substituted hydantoin.

U.S. Pat. No. 4,126,524 to Hradil et al., the subject matter of which is herein incorporated by reference in its entirety, discloses cyanide-free silver electroplating solutions containing silver complexed with imides of organic dicarboxylic acids, such as succinimide.

U.S. Pat. No. 4,246,077 to Hradil et al., the subject matter of which is herein incorporated by reference in its entirety, describes cyanide-free silver electroplating solutions containing silver complexed with pyrrolidine-2,5-dione (succinimide) or 3-pyrroline-2,5-dione (maleimide).

U.S. Pat. No. 5,322,553 to Mandich et al. the subject matter of which is herein incorporated by reference in its entirety describes a cyanide-free electroless silver plating solution comprising a silver cation, thiosulfate, and sulfite. This patent claims a plating rate and solution stability superior to conventional silver plating solutions.

Electroless silver plating also suffers from several deficiencies. For example, the baths are well known to be highly unstable with decomposition occurring readily, causing loss of silver due to precipitation, limited bath life, and un-wanted deposition on surface regions that should remain free of metal. Also, plating rates are generally very slow under conditions necessary for suitable stability.

Faster plating rates can be obtained by electroplating, including light-induced plating as described in the prior art, in which an external power supply provides current to the devices. However, the attachment of an electrical connection can be problematic in that it can result in breakage of fragile silicon solar cells.

Therefore, it would be desirable to provide a plating method that is capable of the faster plating rates realized by electroplating without resulting in breakage of the silicon solar cells from the attachment of an electrical connection and that also minimizes the noted deficiencies of electroless silver plating.

The present invention addresses these deficiencies by using the specified plating solution and method. The improved plating solution of the invention is activated by light when used to plate metal on photovoltaic cells. The plating solution does not contain cyanide. No electrical contact with the device is necessary.

SUMMARY OF THE INVENTION

It is well known that aluminum, while being a non-noble metal, normally remains well passivated by aluminum oxide except at very acidic or alkaline pH's in aqueous solution, since aluminum oxide can be dissolved by acids and bases. Moreover, it may undergo fast, uncontrollable corrosion by reaction with water in acidic or alkaline solution. Therefore, a dilemma is presented in that a neutral or near-neutral pH is desirable in order to avoid uncontrolled corrosion, but aluminum normally remains well-passivated at neutral or near-neutral pH. The inventors have found that inclusion of certain reagents for assisting in the dissolution of the metal on the back surface of the photovoltaic cell can yield steady, controllable dissolution at a more neutral pH.

It is an object of the present invention to provide a method and compositions for plating metallic conductors onto photovoltaic devices by a contact-free, light-assisted autocatalytic or displacement process.

It is another object of the present invention to provide a method and compositions for plating metallic conductors onto photovoltaic devices by an autocatalytic or displacement process that is activated by light.

To that end, in one embodiment, the present invention relates generally to a composition for plating metal contacts on a photovoltaic solar cell, the composition comprising:
  a) a source of soluble silver ions; and
  b) an agent for assisting in the dissolution of the metal on the back surface of the photovoltaic solar cell (usually aluminum or aluminum alloys).

In another embodiment, the present invention relates generally to a method of metallizing a photovoltaic solar cell to deposit a thick layer of metal thereon, said photovoltaic solar cell having a front side and a backside, wherein said backside comprises a layer of a metal selected from the group consisting of aluminum and aluminum alloys and said front side having a metallic pattern thereon, the method comprising the steps of:
  a) contacting the photovoltaic solar cell with an light induced plating composition comprising:
    i) a source of soluble silver ions; and
    ii) an agent that solubilities metal ions dissolved from the metal on the backside; and thereafter
  b) illuminating the photovoltaic solar cell with radiant energy from a light source,
wherein the front side and backside of the solar cell become oppositely charged and metal ions from the plating solution are plated onto the metallic pattern on the frontside of the solar cell, whereby a layer of metal is deposited thereon and wherein ions of the metal layer on the backside are dissolved into the plating solution.

Using this method any metal may be deposited on the front side of the solar cell from an aqueous solution of its ions provided that the metal's reduction potential is greater than that of water. Preferred metals include copper and silver, especially silver, due to their high conductivity.

DESCRIPTION OF TUE DRAWINGS

Figure 4:
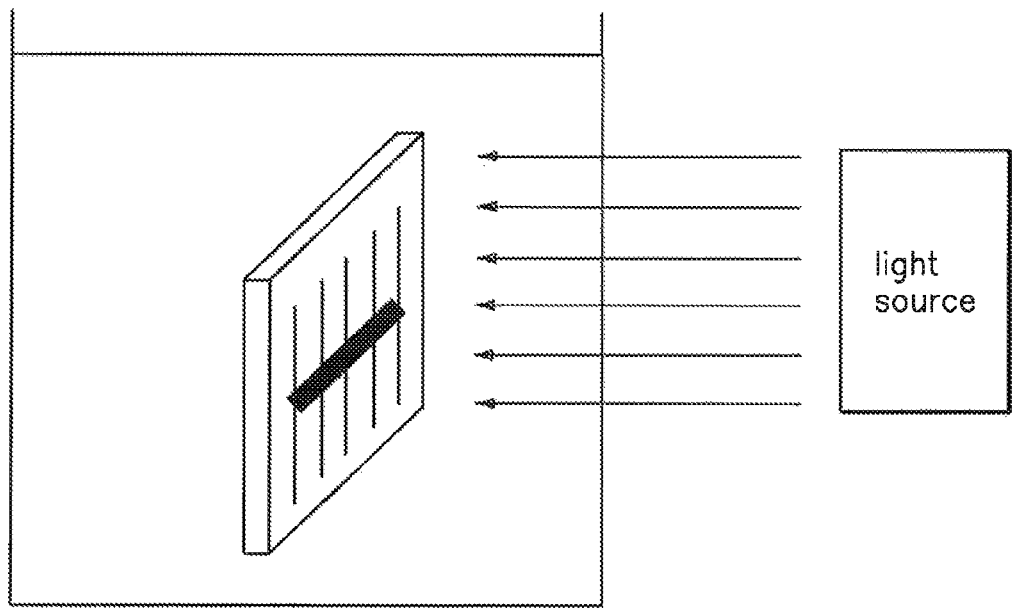

FIG. 1 shows a front side and a backside of a silicon solar cell.
FIG. 2 shows a cross-sectional view of a silicon solar cell.
FIG. 3 shows an embodiment of a prior art light-induced electrolytic plating process.
FIG. 4 shows an embodiment of a light induced plating process in accordance with the present invention.

DETAILED DESCRIPTION OF THE PREFERRED EMBODIMENTS

The present invention relates generally to a method and compositions for plating metallic conductors onto photovoltaic devices by a process which is activated by light and does not require electrical contacts with the device.

In one embodiment, the light induced plating composition of the present invention includes:
- a) a source of soluble silver ions; and
- b) an agent for solubilizing metal ions comprising aluminum and alloy constituents with aluminum.

Almost any compound containing silver (I) can be used in the composition of the invention. The source of soluble silver ions may be silver oxide, silver nitrate, silver methanesulfonate, silver acetate, silver sulfate, silver citrate, or any other silver salt, by way of example and not limitation. In one embodiment, the source of soluble silver ions is preferably silver sulfate, silver acetate, or silver methanesulfonate. In a preferred embodiment the source of soluble silver ions is present in the light induced plating composition of the invention at a concentration yielding about 1 to 35 grams/liter of silver metal.

While not wishing to be bound by theory, the inventors believe that the plating reaction on the front side of the solar cell begins as a reduction of metal cations driven by the electrical potential caused by exposure of the solar cell to light, where negative charges accumulate on the front (cathodic) side of the cell and positive charges ("holes") accumulate on the back (anodic) side. As the plating reaction proceeds, absorption of photons continues to generate electron-hole pairs in the bulk silicon; because of the voltage caused by the p-n diode, negative charges migrate to the front side of the cell and positive charges migrate to the back side. The positive charges, or holes, are neutralized by the transfer of electrons from metallic aluminum on the back side of the cell, accompanied by dissolution of aluminum ions, driving the plating reaction forward. Thus for the smooth continuation of the plating reaction it is important for the plating solution to comprise an agent that solubilizes aluminum ions (and ions of any aluminum alloy constituents) from the back side of the solar cell preferentially to other metals on the back side, especially silver which is typically present in the form of hardened silver paste forming busbars.

The plating composition should include a compound which is capable of solubilizing (either directly or through chelation) aluminum ions dissolved from the back side of the solar cell. The solubilizing compound should be able to solubilize aluminum preferentially over silver. These solubilizing compounds can include glyoxylic acid, glycolic acid, lactic acid or any alpha- or ortho-hydroxycarboxylic acids, aliphatic dicarboxylic acids, hydroxy-polycarboxylic acids such as citric acid, tartaric acid, malic acid or any other hydroxy-polycarboxylic acids. Preferred solubilizing compounds are citric acid, tartaric acid, and glyoxylic acid. The concentration of the solubilizing compound in the plating composition is not critical, but can preferably range from 1 to 150 grams/liter, but is most preferably from 10 to 30 grams/liter.

A reducing agent may be added to the plating composition but it is not required. Without wishing to be bound by theory, the inventors believe the plating reaction may be assisted by a reducing agent through direct transfer of electrons from the reducing agent to either the front side or back side of the cell. If used the reducing agent may include formaldehyde, glucose, dextrose, glyoxal, sugar inverted by nitric acid, hydrazine or hydrazine sulfate, aldonic acids, aldonic lactones, tartrate salts (also known as "Rochelle's salts"), cobalt ions, sulfide salts, sulfite salts, thiosulfate salts, hypophosphite salts, borohydride salts, dimethylamine or other alkylamine borane, hydrazineborane, cyanoborohydride salts, by way of example and not limitations. Other reducing agents known in the art would also be usable in the present invention. In one embodiment, the reducing agent is a glyoxylic acid salt, a Rochelle salt, or glyoxal. In a preferred embodiment, the reducing agent is present in the light induced plating composition of the invention at a concentration of about 1 to about 60 grams/liter, but is most preferably from 15 to 20 grams/liter.

An optional complexing agent may be added to solubilize and stabilize the silver cation and sequester metallic impurities that may be present. Silver complexors include cyanide, succinimide or substituted succinimides, hydantoin or substituted hydantoins, uracil, thiosulfates, ammonia or other amines, by way of example and not limitation. As previously noted, the use of cyanide is undesirable due to safety and environmental concerns. The use of ammonia is also undesirable due to its volatility and its ability to form explosive silver salts upon drying. In a preferred embodiment, the complexing agent is hydantoin or 5,5-dimethylhydantoin, or other substituted hydantoin. If used, the complexing agent may be present in the light induced plating composition at a concentration of about 20 to about 150 grams/liter, more preferably about 40-80 grams/liter.

Finally, the composition of the invention may also include various surface active agents, grain refiners, brighteners, or surfactants. For example, polyethyleneimine, polyethylene glycol, 2,2'-dipyridyl, histidine, cysteine, imidazole or imidazole derivatives, may be added to the composition of the invention by way of example and not limitation. A preferred brightening agent is histidine which the inventors have found to be beneficial to producing a white silver deposited layer.

The pH of the solution is preferably adjusted to between about 7.0 and 12.0, more preferably between about 8.8 to 9.5, using a suitable pH adjuster. Potassium hydroxide, sodium hydroxide, sulfuric acid, or acetic acid, by way of example and not limitation, may be used to adjust the pH of the solution.

As illustrated in FIG. 4, the present invention relates generally to a method of metallizing a photovoltaic solar cell to deposit a layer of metal thereon, said photovoltaic solar cell having a front side and a backside wherein said back side comprises a layer of a metal selected from the group consisting of aluminum and aluminum alloys, and said front side having a metallic pattern thereon, the method comprising the steps of:
- a) contacting the photovoltaic solar cell with an light induced plating composition comprising:
  - i) a source of soluble silver ions; and
  - ii) an agent that solubilizes metal ions dissolved from the metal on the back side; and thereafter
- b) illuminating the photovoltaic, solar cell with radiant energy from a light source, wherein the front side and backside of the solar cell become oppositely charged and metal ions from the light induced plating solution are plated onto the metallic pattern on the frontside of the solar cell, whereby a layer of metal is deposited thereon, and wherein ions of the metal layer on the back side are dissolved into the light induced plating solution.

As discussed above, the metallic pattern on the front side of the solar cell generally comprises a plurality of current collection lines and busbars.

The light source of the invention is positioned to illuminate the photovoltaic solar cell with radiant energy. Various light sources can be used in the practice of the invention, including, for example halogen lamps, incandescent lamps, fluorescent lamps, light emitting diodes, or mercury lamps. Any intensity or wavelength of light can be used, provided that the wavelength is equal to or less than about 1150 nm which corresponds to the band gap energy of silicon.

The step of contacting the photovoltaic cell with the light induced plating composition typically comprises immersing the photovoltaic cell in the plating composition. In the practice of this invention no electrical contact to an external power source is required.

While not wishing to be bound by theory, the inventors believe that there are two possible mechanisms for light-activated plating by reduction of a metal ion on the cathode. Firstly, electrons may be donated to a metal cation directly from the cathode causing the deposition of the metal atoms; since positive charges accumulate on the opposite anodic side, electrons must be supplied to this opposite side, either by oxidation of a chemical reducer present in the plating solution, or oxidation and dissolution of metal from the opposite anodic side. Alternatively, the cathode may catalyze the donation of an electron from the chemical reducer to the metal, resulting in the deposition of the metal ion on the cathode. A combination of these two mechanisms may also be occurring. The result of either mechanism is the same, namely, light-induced deposition of metal occurs selectively onto a metal cathode without the need for attachment of external electrical contacts to the cell.

EXAMPLES

Example 1

A plating solution was made as follows:

| | |
|---|---|
| 72.6 grams/liter | 5,5-dimethylhydantoin |
| 20.2 grams/liter | silver acetate |
| 14.0 grams/liter | potassium methanesulfonate |
| 30.0 grams/liter | sodium potassium tartrate ("Rochelle salt") |

KOH was added to make pH = 9.1

Example 2

A plating solution was made as follows:

| | |
|---|---|
| 72.6 grams/liter | 5,5-dimethylhydantoin |
| 20.2 grams/liter | silver acetate |
| 18.2 grams/liter | glyoxylic acid hydrate |
| 72.7 grams/liter | potassium methane sulfonate |

NaOH was added to make pH = 9.2

Example 3

A plating solution was made as follows:

| | |
|---|---|
| 48.0 grams/liter | hydantoin |
| 10.3 grams/liter | methanesulfonic acid |
| 32.0 grams/liter | boric acid |
| 28.7 grams/liter | silver methanesulfonate |
| 54.0 grams/liter | glyoxylic acid hydrate |

KOH was added to make pH = 8.8

Comparative Example 1

For comparison, a plating solution was made without a solubilizer or reducer as follows:

| | |
|---|---|
| 72.6 grams/liter | 5,5'-dimethylhydantoin |
| 20.2 grams/liter | silver acetate |

NaOH was added to make pH = 9.1

Solar cells as illustrated in FIGS. 1 and 2 were plated with these solutions. The lines on the front side consisted of printed silver paste and were an average of about 82 microns width as measured by a top-down optical microscope. The busbars on the backside consisted of printed silver paste and were a thickness of about 4.5 microns as measured by X-ray fluorescence (XRF).

The plating solutions were heated to 45° C. in a clear glass beaker. Solar cell pieces were immersed in plating solution for 8 minutes while irradiating the front side using a 250 W halogen lamp from a distance of about 5 inches. The cells were then rinsed with deionized water and dried. The post-processing line widths were measured by a top-down optical microscope and the backside busbar thicknesses were measured b XRF.

Table 1 shows the results for front side line width and backside busbar thickness measurements using optical microscopy and XRF respectively.

TABLE 1

| Plating solution | Front side line width (microns) | Backside busbar thickness (microns) |
|---|---|---|
| None (control) | 82 | 4.5 |
| Example 1 | 117 | 5.1 |
| Example 2 | 98 | 5.6 |
| Example 3 | 92 | 3.8 |
| Comparative Example 1 | 81 | 2.8 |

It is observed that there are large increases in front side line widths for Examples 1-3, while Comparative Example 1 shows no increase. In addition, there is a net increase in backside silver busbar thickness for Examples 1-3, while Comparative Example 1 shows a net decrease, indicating that anodic corrosion of the busbar occurs.

Example 4

Comparison was made between a cell plated with silver from a commercial non-cyanide silver electroplating solution (EPI E-Brite 50/50) and the current invention.

A solution of this invention was made as follows:

| | |
|---|---|
| 17.5 grams/liter | silver acetate |
| 52.5 grams/liter | hydantoin |
| 22.8 grams/liter | boric acid |
| 8.7 grains/liter | methanesullonic acid |
| 39.5 grams/liter | Rochelle salt |
| 52.0 grams/liter | glyoxylic acid hydrate |

KOH to was added to adjust the pH to 8.8

Solar cell pieces were plated with these solutions. The lines on the front side consisted of printed silver paste and were an average of about 82 microns width as measured by a top-down optical microscope. A cell piece was plated in the solution of this Example 4 for 8 minutes at 45 C in a clear glass beaker while irradiated the front side using a 250 W lamp from a distance of about 5 inches. For comparison, a cell piece was electroplated in the commercial silver plating bath by clamping a silver wire to the front side silver paste grid, which was then connected to a power supply with inert anode to complete the circuit, and passing a current equivalent to 0.4 amps/dm$^2$ for 180 seconds. The cell pieces were then rinsed with deionized water and dried. The post-processing line widths were measured by a top-down optical microscope.

The average finger width for the un-processed control was about 120 microns as seen by topdown optical microscope. After plating the average finger width was about 130 microns for both the electroplated and light induced plated fingers. The surface profile of the finger plated using the current invention is smoother and more uniform, and the layer of dense deposited silver is thicker for the current invention.

Example 5

Comparison was made of the back side silver paste busbars plated by light induced plating, with and without the inclusion of Rochelle salt.

Solution 5A was made as follows:

| | |
|---|---|
| 13.5 grams/liter | silver sulfate |
| 89.6 grams/liter | 5,5-dimethylhydantoin |
| 36.3 grams/liter | sodium acetate |

KOH to was added to adjust the pH to 9.3

Solution 5B was made identical to solution 5A, except 10.75 grams/liter Rochelle salt was included.

Solar cell pieces were plated with these solutions. Cell pieces were plated in solutions 5A and 5B for 7 minutes at 50 C in a clear glass beaker while irradiating the front side using a 250 W lamp from a distance of about 5 inches. The cell pieces were then rinsed with deionized water and dried.

Severe corrosion of the silver paste comprising the back side busbar is easily observable when plated in solution 5A without the inclusion of Rochelle salt, while no corrosion is visually observable when plated in solution 5B, with the inclusion of Rochelle salt. The thickness of silver in the bus bars was measured by X-ray fluorescence (XRF). For the piece plated in solution 5A non-uniform thicknesses ranging from about 0.1 to 2.7 microns were measured. For the piece plated in solution 5B, a uniform thickness of 3.5 microns was measured.

Example 6

Comparison was made of both the front side silver paste fingers and the back side silver paste busbars after light induced plating, with and without the inclusion of citric acid or Rochelle salt.

Solution 6A was made as follows:

| | |
|---|---|
| 8.6 grams/liter | silver sulfate |
| 54.0 grams/liter | 5,5-dimethylhydantoin |
| 19.0 grams/liter | acetic acid |

KOH to was added to adjust the pH to 9.2

Solutions 6B-6H were made identical to solution 6A, except that the solubilizers shown in Table 2 were included.

TABLE 2

| Plating solution | Solubilizer | Solubilizer concentration (grams/liter) |
|---|---|---|
| 6A | none | n.a. |
| 6B | Rochelle salt | 12.0 |
| 6C | Citric acid | 15.0 |
| 6D | Sulfamic acid | 23.0 |
| 6E | Boric acid | 16.4 |
| 6F | Disodium phosphate | 12.0 |
| 6G | Sodium glucoheptanoate | 12.8 |
| 6H | Glycine | 14.2 |

Solar cell pieces were plated with these solutions. Cell pieces of about 5×5 cm$^2$ were plated in solutions 6A-6H for 6 minutes and 16 minutes at 50 C in a clear glass beaker while irradiating the front side using a 250 W lamp from a distance of about 5 inches. The cell pieces were then rinsed with de-ionized water and dried. Cells were weighed before and after plating to determine the amount of mass gained. The post-processing line widths were measured by a top-down optical microscope and the backside busbar thicknesses were measured by XRF. The un-processed (control) cell had a front side finger width of 94 microns and a back side silver busbar thickness of 7.7 microns.

TABLE 3

| Plating solution | Cell mass gain (milligrams) | | Front side silver finger width (microns) | | Back side silver busbar thickness (microns) | |
|---|---|---|---|---|---|---|
| | 6 min. | 16 min. | 6 min. | 16 min. | 6 min. | 16 min. |
| 6A | 4 | 7 | 106 | 115 | 7.3 | 7.1 |
| 6B | 11 | 51 | 114 | 136 | 7.9 | 9.0 |
| 6C | 12 | 56 | 108 | 138 | 7.8 | 9.6 |
| 6D | 2 | 18 | 103 | 115 | 6.9 | 6.6 |
| 6E | −1 | 7 | 94 | 104 | 5.8 | 5.6 |
| 6F | 1 | 2 | 104 | 107 | 6.4 | 2.9 |
| 6G | 3 | 11 | 110 | 126 | 7.2 | 6.8 |
| 6H | 7 | 9 | 99 | 108 | 6.4 | 6.1 |

It is seen that light induced plating solutions 6B and 6C, containing Rochelle salt and citric acid respectively, gave the largest mass gains and finger widths after plating.

What is claimed is:
1. A method of metalizing a photovoltaic solar cell to deposit a layer of metal thereon, said photovoltaic solar cell having a front side and a backside, wherein said back side comprises a layer of a metal selected from the group consisting of aluminum and aluminum alloys and said front side comprising a pattern comprising metal thereon, the method comprising the steps of:
   a) contacting the photovoltaic solar cell with a light induced plating composition comprising:
      i) a source of soluble silver ions;
      ii) a complexing agent for the silver ions; and
      iii) an agent that solubilizes aluminum metal ions, dissolved from the layer of metal on the back side, selected from the group consisting of alpha-hydroxy carboxylic acids, ortho hydroxy-carboxylic acids, aliphatic dicarboxylic acids, and hydroxyl polycarboxylic acids, and combinations of the foregoing;
   b) illuminating the photovoltaic solar cell with radiant energy from a light source,
wherein metal ions from the light induced plating solution are plated onto the metallic pattern on the frontside of the solar cell, and wherein the solar cell is not electrically connected to an external power source during the plating, and wherein ions of the metal layer on the back side are dissolved into the light induced plating composition.

2. The method according to claim 1, wherein the source of soluble silver ions is selected from the group consisting of silver oxide, silver nitrate, silver methanesulfonate, silver acetate, silver citrate, silver sulfate and combinations of one or more of the foregoing.

3. The method according to claim 2, wherein the source of soluble silver ions is silver acetate.

4. The method according to claim 2, wherein the source of soluble silver ions is silver methanesulfonate.

5. The method according to claim 2, wherein the source of soluble silver ions is silver sulfate.

6. The method according to claim 1, wherein the concentration of soluble silver ions is between about 1 and about 35 grams/liter.

7. The method according to claim 1, wherein the solubilizing agent is selected from the group consisting of glyoxylic acid, glycolic acid, lactic acid, tartaric acid, citric acid, malic acid or any combinations of the foregoing.

8. The method according to claim to claim 7, wherein the solubilizing agent comprises tartaric acid or salts thereof.

9. The method according to claim 7, wherein the solubilizing agent comprises citric acid or salts thereof.

10. The method according to claim 1, wherein the concentration of the solubilizing agent is between about 1 to 10 grams/liter, but is most preferably from 10 to 30 grams/liter.

11. The method according to claim 1, wherein the complexing agent is selected from the group consisting of cyanide, succinimide or substituted succinimide, hydantoin or substituted hydantoin, uracil, thiosulfate, amines and combinations of one or more of the foregoing.

12. The method according to claim 11, wherein the complexing agent is hydantoin or substituted hydantoin.

13. The method according to claim 1, wherein the concentration of the complexing agent is between about 20 to about 150 grams/liter.

14. The method according to claim 1, wherein the pattern comprising metal on the front side of the solar cell comprises current collection lines and busbars printed thereon.

15. The method according to claim 14, wherein the pattern comprising metal comprises printed silver paste.

16. The method according to claim 1, wherein the light source is selected from the group consisting of halogen lamps, incandescent lamps, fluorescent lamps, light emitting diodes, or mercury lamps.

17. The method according to claim 1, wherein the step of contacting the photovoltaic cell with the light induced plating composition comprises immersing the photovoltaic cell in the light induced plating composition.

* * * * *